US 9,595,926 B2

(12) United States Patent
Quaglietta

(10) Patent No.: US 9,595,926 B2
(45) Date of Patent: Mar. 14, 2017

(54) APPARATUS AND METHODS FOR OVERDRIVE PROTECTION OF RADIO FREQUENCY AMPLIFIERS

(71) Applicant: Skyworks Solutions, Inc., Woburn, MA (US)

(72) Inventor: Anthony Francis Quaglietta, Methuen, MA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

(21) Appl. No.: 14/811,383

(22) Filed: Jul. 28, 2015

(65) Prior Publication Data

US 2016/0036395 A1   Feb. 4, 2016

Related U.S. Application Data

(60) Provisional application No. 62/030,257, filed on Jul. 29, 2014.

(51) Int. Cl.
*H04B 1/40* (2015.01)
*H03F 1/52* (2006.01)
(Continued)

(52) U.S. Cl.
CPC ........... *H03F 1/523* (2013.01); *H03F 1/0261* (2013.01); *H03F 3/195* (2013.01); *H03F 3/245* (2013.01); *H03F 3/72* (2013.01); *H03F 2200/27* (2013.01); *H03F 2200/294* (2013.01); *H03F 2200/321* (2013.01); *H03F 2200/336* (2013.01); *H03F 2200/411* (2013.01); *H03F 2200/451* (2013.01); *H03F 2200/511* (2013.01);
(Continued)

(58) Field of Classification Search
CPC .......... H03F 1/523; H03F 3/193; H03F 3/211; H03F 3/195; H03F 2203/21109; H03F 2200/294; H04B 7/005
See application file for complete search history.

(56) References Cited

U.S. PATENT DOCUMENTS

| | | |
|---|---|---|
| 4,945,445 A | 7/1990 | Schmerda et al. |
| 6,150,714 A | 11/2000 | Andreycak et al. |

(Continued)

FOREIGN PATENT DOCUMENTS

WO    WO 2011/152921 A2    12/2011

*Primary Examiner* — Md Talukder
(74) *Attorney, Agent, or Firm* — Knobbe Martens Olson & Bear LLP

(57) ABSTRACT

Provided herein are apparatus and methods for overdrive protection of radio frequency (RF) amplifiers. In certain configurations, an RF amplifier includes a plurality of amplification stages and an overdrive detection circuit. The overdrive detection circuit determines whether or not the RF amplifier is in an overdrive condition based on a current of an input amplification stage. Additionally, when the overdrive detection circuit detects an overdrive condition, the overdrive detection circuit controls an impedance of one or more feedback circuits of one or more amplification stages subsequent to the input amplification stage in a signal path of the RF amplifier to reduce the RF amplifier's gain. The overdrive protection schemes herein can be used to limit large current and voltage swing conditions manifesting within amplification transistors of the RF amplifier.

20 Claims, 7 Drawing Sheets

(51) Int. Cl.
*H03F 1/02* (2006.01)
*H03F 3/195* (2006.01)
*H03F 3/24* (2006.01)
*H03F 3/72* (2006.01)

(52) U.S. Cl.
CPC .... *H03F 2200/516* (2013.01); *H03F 2200/78* (2013.01); *H03F 2203/7203* (2013.01); *H03F 2203/7206* (2013.01)

(56) References Cited

U.S. PATENT DOCUMENTS

| | | | |
|---|---|---|---|
| 6,424,035 B1 | 7/2002 | Sapp et al. | |
| 7,054,605 B1 * | 5/2006 | Groe | H04B 1/28 455/232.1 |
| 7,515,000 B1 | 4/2009 | Jin et al. | |
| 8,154,345 B2 | 4/2012 | Andrys et al. | |
| 8,362,840 B2 | 1/2013 | Andrys | |
| 2004/0185814 A1 * | 9/2004 | Inamori | H03G 1/0088 455/232.1 |
| 2007/0216485 A1 * | 9/2007 | Fujii | H03F 1/342 330/286 |
| 2008/0197928 A1 * | 8/2008 | Watson | H03F 3/45475 330/260 |
| 2009/0058525 A1 * | 3/2009 | Damitio | H03F 3/45085 330/257 |
| 2009/0102493 A1 | 4/2009 | Disney et al. | |
| 2011/0291765 A1 * | 12/2011 | Sun | H03F 1/52 330/298 |
| 2011/0292554 A1 * | 12/2011 | Yao | H03F 1/52 361/56 |
| 2011/0298538 A1 * | 12/2011 | Andrys | H03F 1/0261 330/127 |
| 2012/0187930 A1 * | 7/2012 | Williams | G05F 1/5735 323/273 |
| 2013/0300507 A1 * | 11/2013 | Sutardja | H03F 3/21 330/294 |
| 2014/0197892 A1 * | 7/2014 | Gorbachov | H03F 1/34 330/293 |
| 2014/0266470 A1 * | 9/2014 | Maxim | H03F 1/14 330/307 |
| 2015/0256138 A1 * | 9/2015 | Dasgupta | H03F 3/211 330/255 |
| 2016/0036395 A1 * | 2/2016 | Quaglietta | H03F 1/523 455/75 |

* cited by examiner

APPARATUS AND METHODS FOR OVERDRIVE PROTECTION OF RADIO FREQUENCY AMPLIFIERS

CROSS-REFERENCE TO RELATED APPLICATIONS

This application claims the benefit of priority under 35 U.S.C. §119(e) of U.S. Provisional Patent Application No. 62/030,257, filed Jul. 29, 2014 and titled "APPARATUS AND METHODS FOR OVERDRIVE PROTECTION OF RADIO FREQUENCY AMPLIFIERS," which is herein incorporated by reference in its entirety.

BACKGROUND

Field

Embodiments of the invention relate to electronic systems, and in particular, to radio frequency (RF) electronics.

Description of the Related Technology

RF amplifiers can be used to boost the amplitude of a relatively weak RF signal. Thereafter, the boosted RF signal can be used for a variety of purposes, including, for example, driving an antenna, a switch, a mixer and/or a filter in an RF system. RF amplifiers can be included in base stations or mobile devices to amplify signals of a wide range of frequencies.

One example of an RF amplifier is a power amplifier, which can be included in a base station or mobile device to amplify an RF signal for transmission. When communicating using a cellular standard, a wireless local area network (WLAN) standard, and/or any other suitable communication standard, a power amplifier can be used to amplify the RF signal to a power level suitable for transmission via an antenna.

SUMMARY

In certain embodiments, the present disclosure relates to a radio frequency (RF) amplification system. The RF amplification system includes a plurality of RF amplification stages configured to amplify an RF input signal to generate an RF output signal. The plurality of RF amplification stages includes a first amplification stage and a second amplification stage that is subsequent to the first amplification stage in a signal path. The second amplification stage includes a second stage transistor and a second stage feedback circuit electrically connected between an input and an output of the second stage transistor. The RF amplification system further includes an overdrive detection circuit configured to sense a current of the first amplification stage to detect when an overdrive condition is present. The overdrive detection circuit is further configured to decrease an impedance of the second stage feedback circuit in response to detection of the overdrive condition.

In some embodiments, the first amplification stage is an input amplification stage and the second amplification stage is an output amplification stage.

In a number of embodiments, the first amplification stage is an input amplification stage and the second amplification stage is an intermediate amplification stage.

According to various embodiments, the RF amplification system further includes a sense resistor configured to receive the current of the first amplification stage. In some embodiments, the overdrive detection circuit further includes a comparator configured to compare a voltage across the sense resistor to a reference voltage, and to control the impedance of the second stage feedback circuit based on the comparison.

In accordance with certain embodiments, the plurality of RF amplification stages further includes one or more intermediate amplification stages arranged in a cascade between an output of the first amplification stage and an input of the second amplification stage. In some embodiments, a first intermediate amplification stage of the one or more intermediate amplification stages includes an intermediate stage transistor and an intermediate stage feedback circuit electrically connected between an input and an output of the intermediate stage transistor, and the overdrive detection circuit is further configured to decrease an impedance of the intermediate stage feedback circuit in response to detection of the overdrive condition.

In a number of embodiments, the second stage feedback circuit includes a field effect transistor (FET) electrically connected in parallel with a first resistor, and the overdrive detection circuit is further configured to control a gate voltage of the FET.

In several embodiments, the overdrive detection circuit is further configured to control the gate voltage of the FET to either turn on the FET or to turn off the FET.

In various embodiments, the overdrive detection circuit is further configured to control the gate voltage of the FET with an analog voltage that is based on a magnitude of the current of the first amplification stage.

In some embodiments, the plurality of RF amplification stages includes a plurality of power amplifier (PA) stages.

In a number of embodiments, the RF amplification system of claim 1 wherein the plurality of RF amplification stages includes a plurality of low noise amplifier (LNA) stages.

According to various embodiments, the plurality of RF amplification stages includes a plurality of driver amplifier (DA) stages.

In accordance with certain embodiments, the second stage transistor is a bipolar transistor and the second stage feedback circuit is a base-to-collector feedback circuit electrically connected between a base and a collector of the second stage transistor.

In a number of embodiments, the second stage transistor is a FET and the second stage feedback circuit is a gate-to-drain feedback circuit electrically connected between a gate and a drain of the second stage transistor.

In certain embodiments, the present disclosure relates to a method of amplifier overdrive protection. The method includes detecting an overdrive condition of an RF amplifier based on sensing a current of a first amplification stage of the RF amplifier using an overdrive detection circuit. The method further includes decreasing a gain of the RF amplifier by decreasing an impedance of a feedback circuit of a second amplification stage of the RF amplifier in response to detecting the overdrive condition. The second amplification stage is subsequent to the first amplification stage in a signal path of the RF amplifier, and the feedback circuit is electrically connected between an input and an output of an amplification transistor of the second amplification stage.

In some embodiments, detecting the overdrive condition includes providing the current of the first amplification stage to a sense resistor and comparing a voltage across the sense resistor to a reference voltage.

According to various embodiments, decreasing the impedance of the feedback circuit includes gradually decreasing the impedance of the feedback circuit to inhibit to a sudden change in the gain of the RF amplifier.

In several embodiments, the method further includes generating an analog voltage based on a magnitude of the current of the first amplification stage and controlling a gate voltage of a FET of the feedback circuit using the analog voltage.

In certain embodiments, the present disclosure relates to a wireless device. The wireless device includes a transceiver configured to generate a radio frequency (RF) signal, a power amplifier including a plurality of power amplifier stages arranged in a cascade, and an overdrive detection circuit. The plurality of power amplifier stages is configured to amplify the RF signal to generate an amplified RF signal. The plurality of power amplifier stages includes a first amplification stage and a second amplification stage that is subsequent to the first amplification stage in a signal path of the power amplifier. The second amplification stage includes a second stage bipolar transistor and a second stage feedback circuit electrically connected between a base and a collector of the second stage bipolar transistor. The overdrive detection circuit is configured to sense a current of the first amplification stage to detect when an overdrive condition is present. The overdrive detection circuit is further configured to decrease an impedance of the second stage feedback circuit in response to detection of the overdrive condition.

DETAILED DESCRIPTION OF EMBODIMENTS

The headings provided herein, if any, are for convenience only and do not necessarily affect the scope or meaning of the claimed invention.

Absent an overdrive protection scheme, providing a large input signal to an RF amplifier can result in high current and/or voltage manifesting on the RF amplifier's amplification transistors. Such high current and/or voltage can cause permanent electrical overstress damage to the amplification transistors such that they are no longer able to operate and/or such that their operation is impaired. In multi-stage RF amplifier configurations in which each amplification stage provides amplification to the input signal, damage can occur in a later stage of the RF amplifier, such as in an output stage.

There is a need for improved RF amplification systems, such as power amplifier systems, in which amplification transistors are protected from overdrive conditions arising from large input signals.

Apparatus and methods for overdrive protection of RF amplifiers are provided herein. In certain configurations, an RF amplifier includes a plurality of stages and an overdrive detection circuit. The overdrive detection circuit determines whether or not the RF amplifier is in an overdrive condition based on a current of a first or input stage. Additionally, when the overdrive detection circuit detects an overdrive condition, the overdrive detection circuit controls an impedance of a feedback circuit of a stage subsequent to the input stage in a signal path of the RF amplifier to reduce the RF amplifier's gain. The overdrive protection schemes herein can be used to limit large current and voltage swing conditions manifesting within amplification transistors of the RF amplifier.

Figure 1:
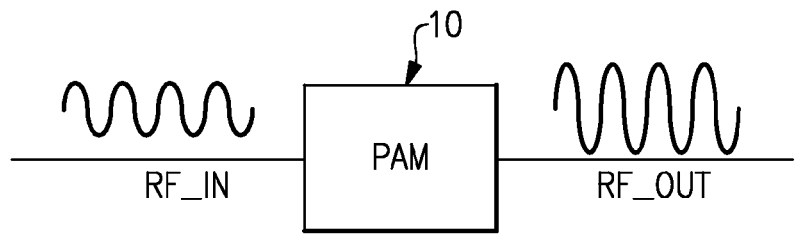
FIG. 1 is a schematic diagram of a power amplifier module for amplifying a radio frequency (RF) signal.

FIG. 1 is a schematic diagram of a power amplifier module 10 for amplifying a radio frequency (RF) signal. The illustrated power amplifier module (PAM) 10 amplifies an RF signal RF_IN to generate an amplified RF signal RF_OUT. As described herein, the power amplifier module 10 can include one or more power amplifiers, including multi-stage power amplifiers. The power amplifier module 10 can include an overdrive protection scheme in accordance with the teachings herein.

Figure 2:
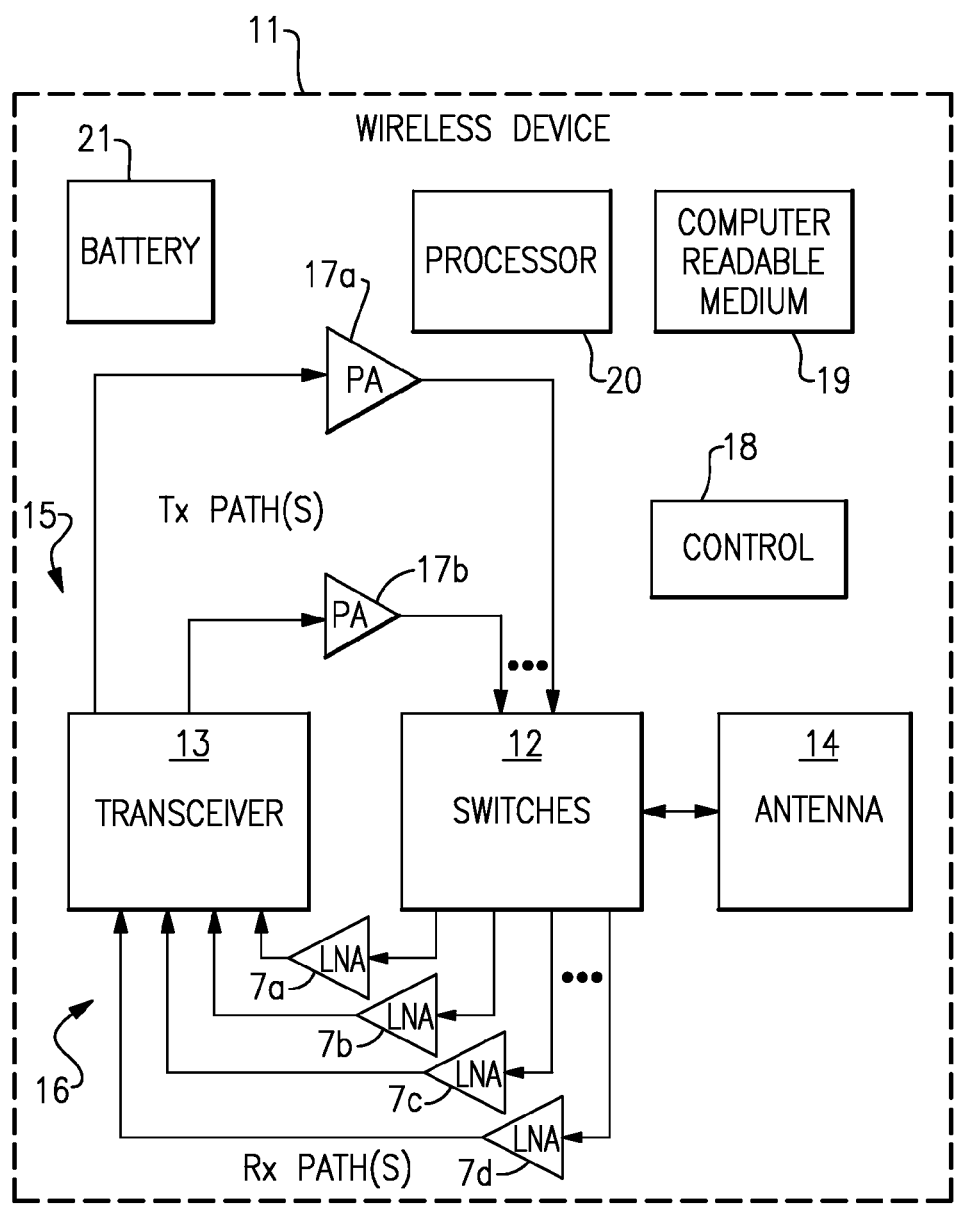
FIG. 2 is a schematic block diagram of an example wireless device that can include one or more of the power amplifier modules of FIG. 1.

FIG. 2 is a schematic block diagram of an example wireless or mobile device 11 that can include one or more of the power amplifier modules of FIG. 1. The wireless device 11 can include overdrive protection circuitry implementing one or more features of the present disclosure. For example, the illustrated power amplifiers and/or low noise amplifiers can include overdrive protection schemes implemented in accordance with the teachings herein.

The example wireless device 11 depicted in FIG. 2 can represent a multi-band and/or multi-mode device such as a multi-band/multi-mode mobile phone. In certain embodiments, the wireless device 11 can include low noise amplifiers (LNAs) 7a-7d, switches 12, a transceiver 13, an antenna 14, power amplifiers 17a, 17b, a control component 18, a computer readable medium 19, a processor 20, and a battery 21.

The transceiver 13 can generate RF signals for transmission via the antenna 14. Furthermore, the transceiver 13 can receive incoming RF signals from the antenna 14.

It will be understood that various functionalities associated with the transmission and receiving of RF signals can be achieved by one or more components that are collectively represented in FIG. 2 as the transceiver 13. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 2 as the antenna 14. For example, a single antenna can be configured to provide both transmitting and receiving functionalities. In another example, transmitting and receiving functionalities can be provided by separate antennas. In yet another example, different bands associated with the wireless device 11 can be provided with different antennas.

In FIG. 2, one or more output signals from the transceiver 13 are depicted as being provided to the antenna 14 via one or more transmission paths 15. In the example shown, different transmission paths 15 can represent output paths associated with different bands and/or different power outputs. For instance, the two example power amplifiers 17a, 17b shown can represent amplifications associated with different power output configurations (e.g., low power output and high power output), and/or amplifications associated with different bands. Although FIG. 2 illustrates a configuration using two transmission paths 15, the wireless device 11 can be adapted to include more or fewer transmission paths 15.

The power amplifiers 17a, 17b can be used to amplify a wide variety of RF signals, including, for example, signals associated with cellular or wide local area network (WLAN) communications standards. Each of the power amplifiers 17a, 17b need not amplify the same type of signal. For example, one power amplifier can amplify a WLAN signal, while another power amplifier can amplify, for example, a Global System for Mobile (GSM) signal, a code division multiple access (CDMA) signal, a W-CDMA signal, a Long Term Evolution (LTE) signal, or an EDGE signal.

One or more features of the present disclosure can be implemented in the foregoing example modes and/or bands, and in other communication standards.

In FIG. 2, one or more detected signals from the antenna 14 are depicted as being provided to the transceiver 13 via one or more receiving paths 16. In the example shown, different receiving paths 16 can represent paths associated with different bands. Although FIG. 2 illustrates a configuration using four receiving paths 16, the wireless device 11 can be adapted to include more or fewer receiving paths 16. As shown in FIG. 2, one or more of the receiving paths 16 can include a low noise amplifier (LNA). In the illustrated configuration, a first receiving path includes a first LNA 7a, a second receiving path includes a second LNA 7b, a third receiving path includes a third LNA 7c, and a fourth receiving path includes a fourth LNA 7d. However, other configurations are possible.

To facilitate switching between receive and transmit paths, the switches 12 can be configured to electrically connect the antenna 14 to a selected transmit or receive path. Thus, the switches 12 can provide a number of switching functionalities associated with an operation of the wireless device 11. In certain embodiments, the switches 12 can include a number of switches configured to provide functionalities associated with, for example, switching between different bands, switching between different power modes, switching between transmission and receiving modes, or some combination thereof. The switches 12 can also be configured to provide additional functionality, including filtering and/or duplexing of signals.

FIG. 2 shows that in certain embodiments, a control component 18 can be provided for controlling various control functionalities associated with operations of the switches 12, the power amplifiers 17a, 17b, LNAs 7a-7d, and/or other operating component(s).

In certain embodiments, a processor 20 can be configured to facilitate implementation of various processes described herein. The processor 20 can operate using computer program instructions, which can be stored in a computer-readable memory 19.

The battery 21 can be any suitable battery for use in the wireless device 11, including, for example, a lithium-ion battery.

Figure 3:
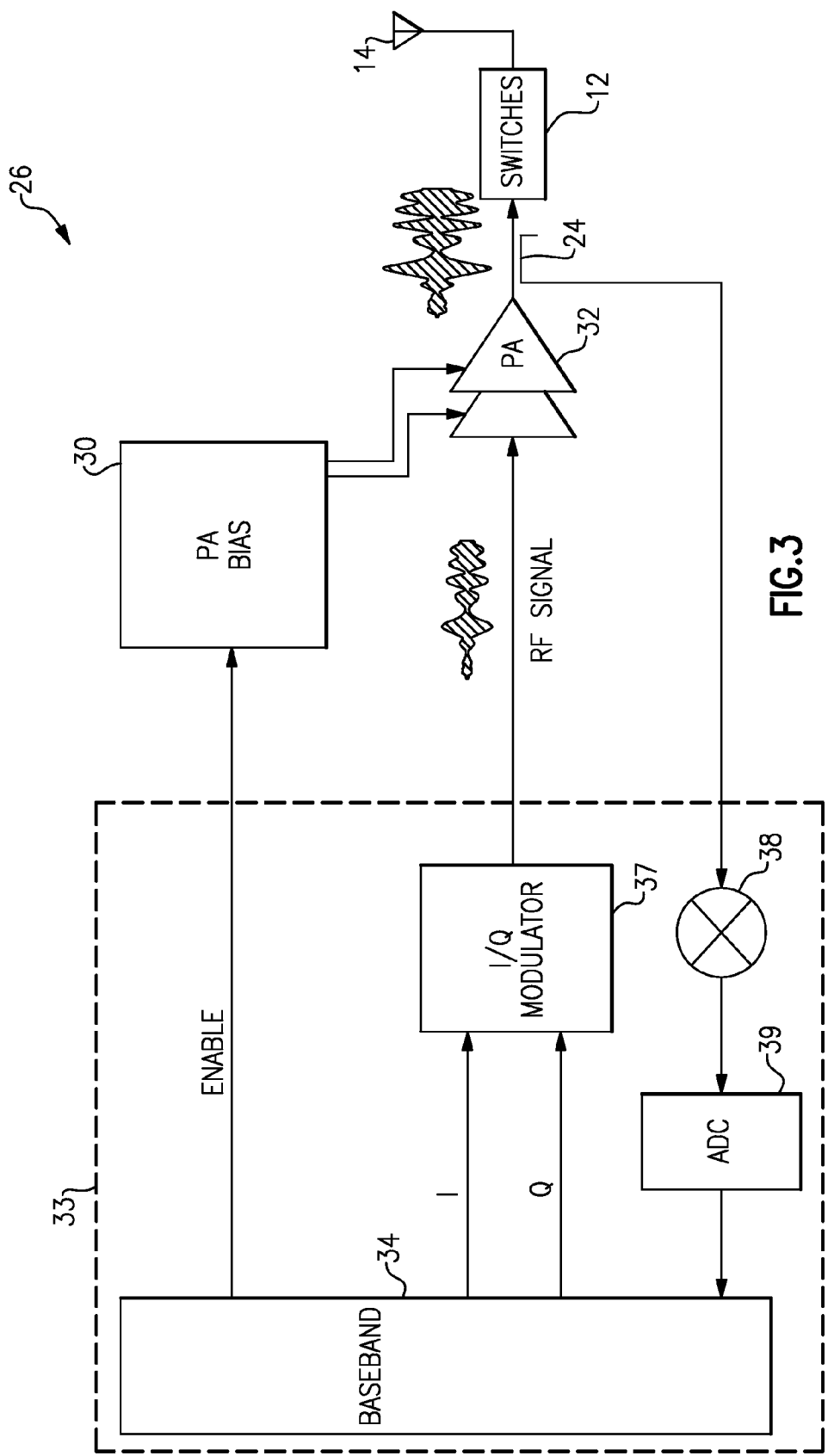
FIG. 3 is a schematic block diagram of one example of a power amplifier system.

FIG. 3 is a schematic block diagram of one example of a power amplifier system 26. The illustrated power amplifier system 26 includes the switches 12, the antenna 14, a directional coupler 24, a power amplifier bias circuit 30, a power amplifier 32, and a transceiver 33. The illustrated transceiver 33 includes a baseband processor 34, an I/Q modulator 37, a mixer 38, and an analog-to-digital converter (ADC) 39. Although not illustrated in FIG. 3 for clarity, the transceiver 33 can include circuitry associated with receiving signals over one or more receive paths.

The baseband signal processor 34 can be used to generate an in-phase (I) signal and a quadrature-phase (Q) signal, which can be used to represent a sinusoidal wave or signal of a desired amplitude, frequency, and phase. For example, the I signal can be used to represent an in-phase component of the sinusoidal wave and the Q signal can be used to represent a quadrature component of the sinusoidal wave, which can be an equivalent representation of the sinusoidal wave. In certain implementations, the I and Q signals can be provided to the I/Q modulator 37 in a digital format. The baseband processor 34 can be any suitable processor configured to process a baseband signal. For instance, the baseband processor 34 can include a digital signal processor, a microprocessor, a programmable core, or any combination thereof. Moreover, in some implementations, two or more baseband processors 34 can be included in the power amplifier system 26.

The I/Q modulator 37 can be configured to receive the I and Q signals from the baseband processor 34 and to process the I and Q signals to generate an RF signal. For example, the I/Q modulator 37 can include digital-to-analog converters (DACs) configured to convert the I and Q signals into an analog format, mixers for upconverting the I and Q signals to radio frequency, and a signal combiner for combining the upconverted I and Q signals into an RF signal suitable for amplification by the power amplifier 32. In certain implementations, the I/Q modulator 37 can include one or more filters configured to filter frequency content of signals processed therein.

The power amplifier bias circuit 30 can receive an enable signal ENABLE from the transceiver 33, and can generate one or more bias signals for the power amplifier 32. The bias signals can comprise current and/or voltage signals, and can be used, for example, to bias bases of bipolar transistors associated with the power amplifier's stages. When the enable signal ENABLE is activated, the power amplifier bias circuit 30 can generate the bias signals to bias the power amplifier 32 in a manner suitable for amplifying the RF signal. However, when the enable signal ENABLE is deactivated, the power amplifier bias circuit 30 can generate the bias signals to deactivate the power amplifier 32.

Accordingly, the enable signal ENABLE can be used to turn on or off the power amplifier 32. In certain configurations, the enable signal ENABLE can be turned on or off during operation to pulse the output of the power amplifier 32. For example, when the power amplifier 32 is configured to transmit a WLAN signal, the enable signal ENABLE can be selectively controlled so as to pulse the output of the power amplifier 32.

The power amplifier 32 can receive the RF signal from the I/Q modulator 37 of the transceiver 33, and when enabled can provide an amplified RF signal to the antenna 14 via the switches 12. The directional coupler 24 can be positioned between the output of the power amplifier 32 and the input of the switches 12, thereby allowing an output power measurement of the power amplifier 32 that does not include insertion loss of the switches 12. However, other configurations of power measurement are possible.

In the illustrated configuration, the sensed output signal from the directional coupler 24 is provided to the mixer 38, which multiplies the sensed output signal by a reference signal of a controlled frequency. The mixer 38 operates to generate a downshifted signal by downshifting the sensed output signal's frequency content. The downshifted signal can be provided to the ADC 39, which can convert the downshifted signal to a digital format suitable for processing by the baseband processor 34. By including a feedback path between the output of the power amplifier 32 and the baseband processor 34, the baseband processor 34 can be configured to dynamically adjust the I and Q signals to optimize the operation of the power amplifier system 26. For example, configuring the power amplifier system 26 in this manner can aid in controlling the power added efficiency (PAE) and/or linearity of the power amplifier 32. However, other configurations of power control can be used.

Overview of Examples of Radio Frequency Amplifiers with Overdrive Protection

When a power amplifier or other radio frequency (RF) amplifier is overdriven with a large RF input signal, the power amplifier's active devices can operate with large current and voltage swings. For example, the power amplifier can include bipolar transistors that operate in saturation when an RF signal of a relatively large magnitude is provided to the power amplifier's input. Signaling conditions associated with overdrive can lead to device damage, such as junction damage associated with large collector currents and/or large base-to-collector or collector-to-emitter voltage swings. A power amplifier that can withstand a large input overdrive voltage can have a high ruggedness.

Certain conventional overdrive protection schemes can improve a power amplifier's ruggedness, but can also undesirably degrade the power amplifier's performance. For example, certain power amplifiers can include output clamps, such as diode stacks, and/or large resistors in DC or RF voltage feeds, which can degrade the power amplifier's linearity and/or power added efficiency (PAE).

Provided herein are apparatus and methods for overdrive protection of RF amplifiers. In certain configurations, an RF amplifier includes an overdrive detection circuit and two or more amplification stages including an input amplification stage and an output amplification stage. The overdrive detection circuit is configured to detect a current of the input amplification stage of the RF amplifier to determine whether or not the RF amplifier is in an overdrive condition. For example, in certain implementations, a current of the input amplification stage flows through a sense resistor, and the overdrive detection circuit compares a voltage across the sense resistor to a reference voltage to determine whether or not the RF amplifier has been overdriven.

Additionally, in response to detection of an overdrive condition, the overdrive detection circuit controls a feedback circuit of one or more amplification stages subsequent to the input amplification stage in a signal path to reduce the RF amplifier's gain. For example, the output amplification stage can include a bipolar transistor and a base-to-collector feedback circuit electrically connected between the bipolar transistor's base and collector. As persons having ordinary skill in the art will appreciate, reducing impedance between the output and input of a transistor reduces gain.

For example, when an amplification stage is implemented using a bipolar transistor, the impedance of a feedback circuit between the collector (output) and the base (input) of the bipolar transistor can be reduced to decrease the amplification stage's gain. Additionally, when an amplification stage is implemented using a field effect transistor (FET), the impedance of a feedback circuit between the drain (output) and the gate (input) of the FET can be reduced to decrease the amplification stage's gain. When the gain is reduced, less amplification of the input signal occurs and less current and voltage is manifested within the amplification transistors.

Configuring a power amplifier or other RF amplifier in this manner can help limit large current and voltage swings in the power amplifier. Moreover, such an overdrive protection scheme can enhance the power amplifier's performance in the presence of variations in voltage standing wave ratio (VSWR), and can have a relatively small impact on normal operating performance of a power amplifier when normal signaling conditions are present.

In certain configurations, the overdrive detection circuit reduces an impedance of two or more feedback circuits of the RF amplifier when an overdrive condition is detected. For example, an RF amplifier can include three or more stages electrically connected in a cascade, and the overdrive detection circuit can reduce the impedance of feedback circuits associated with two or more stages subsequent to the input stage in a signal path. Configuring the overdrive detection circuit in this manner can help to further limit large current and/or voltage swings relative to a configuration in which the overdrive detection circuit controls an impedance of a feedback circuit of a single stage.

The overdrive detection circuit can control an impedance of a feedback circuit in a variety of ways. In certain configurations, a feedback circuit includes a field-effect transistor (FET) having a channel electrically connected between an input (for example, a base or gate) and an output (for example, a collector or drain) of an amplification transistor that provides amplification for the RF amplifier. Additionally, the FET can be electrically connected in parallel with a resistor or other impedance that can be bypassed when the FET is turned on. For example, the overdrive detection circuit can control a gate voltage of the FET to control an overall impedance of the feedback circuit. In certain configurations, the overdrive detection circuit can gradually turn on the FET in response to detection of an overdrive condition to inhibit a sudden change in the RF amplifier's gain. In other configurations, the overdrive detection circuit can control the FET either in a high-impedance OFF state or in a low-impedance ON state.

Figure 4:
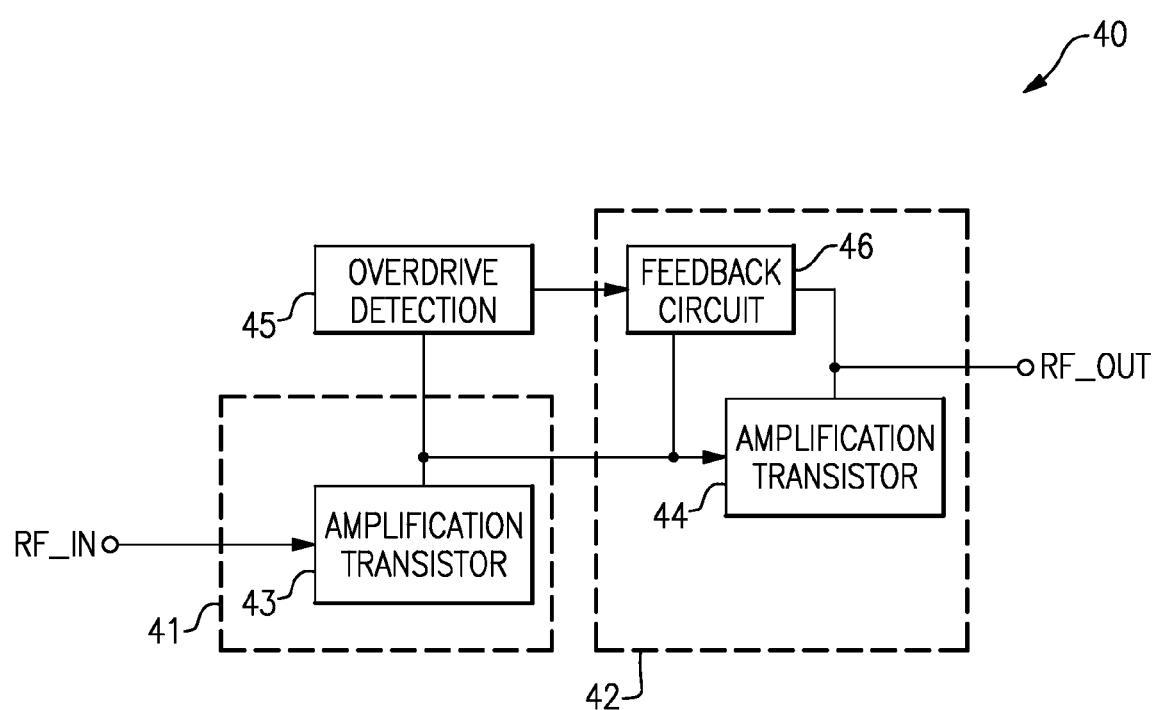
FIG. 4 is a schematic block diagram of one embodiment of an RF amplification system.

FIG. 4 is a schematic block diagram of one embodiment of an RF amplification system 40. The RF amplification system 40 includes a first RF amplification stage 41, a second RF amplification stage 42, and an overdrive detection circuit 45. As shown in FIG. 4, the first and second RF amplification stages 41, 42 are electrically connected in a cascade. Although FIG. 4 illustrates the RF amplification system 40 as including two RF amplification stages, the RF amplification system 40 can include one or more additional RF amplification stages. For example, the RF amplification system 40 can include three or more RF amplification stages electrically connected in a cascade.

The first RF amplification stage 41 includes a first amplification transistor 43. Additionally, the second RF amplification stage 42 includes a second amplification transistor 44 and a feedback circuit 46. The first and second amplification transistors 43, 44 can be implemented in a variety of configurations, and can be bipolar transistors, field-effect transistors (FETs), or a combination thereof. As shown in FIG. 4, the feedback circuit 46 is electrically connected between an input and an output of the second amplification transistor 44. In one embodiment, the second amplification transistor 44 is a bipolar transistor, and the feedback circuit 46 is implemented as a base-to-collector feedback circuit that is electrically connected between the base and the collector of the second amplification transistor 44. In another embodiment, the second amplification transistor 44 is a FET, and the feedback circuit 46 is implemented as a gate-to-drain feedback circuit that is electrically connected between the gate and the drain of the second amplification transistor 44.

The RF amplification system 40 can correspond to a wide variety of RF amplification systems, including, for example, a power amplifier system, a low noise amplification system, or a driver amplifier system. In one embodiment, the first and second RF amplification stages 41, 42 are power amplifier stages. In another embodiment, the first and second RF amplification stages 41, 42 are LNA stages. In yet another embodiment, the first and second RF amplification stages 41, 42 are driver amplifier (DA) stages.

The RF amplification system 40 operates to amplify an RF input signal RF_IN to generate an RF output signal RF_OUT. In certain configurations, the first and second amplification transistors 43, 44 are implemented using bipolar transistors, and a base of the first amplification transistor 43 receives the RF input signal RF_IN. Additionally, the collector of the first amplification transistor 43 is electrically connected to the base of the second amplification transistor 44, and the collector of the second amplification transistor 44 generates the RF output signal RF_OUT. In other configurations, the first and second amplification transistors 43, 44 are implemented using FETs, and a gate of the first amplification transistor 43 receives the RF input signal RF_IN. Additionally, the drain of the first amplification transistor 43 is electrically connected to the gate of the second amplification transistor 44, and the drain of the second amplification transistor 44 generates the RF output signal RF_OUT.

The overdrive detection circuit 45 operates to detect a current of the first RF amplification stage 41 to determine whether or not the RF amplification system 40 is in an overdrive condition. In response to detection of an overdrive condition, the overdrive detection circuit 45 controls the feedback circuit 46 of the second RF amplification stage 42 to reduce the RF amplifier's gain. For example, when the second amplification transistor 44 is implemented as a bipolar transistor, the overdrive detection circuit 45 can control the feedback circuit 46 to reduce the impedance between the second amplification transistor's collector and base to decrease gain. Additionally, when the second amplification transistor 44 is implemented as a FET, the overdrive detection circuit 45 can control the feedback circuit 46 to reduce the impedance between the second amplification transistor's drain and gate to decrease gain. When gain is reduced, less amplification of the RF input signal RF_IN occurs and less current and voltage is manifested within the second amplification transistor 44.

In certain configurations, an RF amplification system includes three or more RF amplification stages. In such configurations, an overdrive detection circuit can be used to detect an overdrive condition based on a current of first or input RF amplification stage. Additionally, the overdrive detection circuit can reduce the RF amplification system's gain in response to detecting the overdrive condition by controlling at least one feedback circuit. In one embodiment, the overdrive detection circuit is configured to control at least two feedback circuits to reduce gain in response to detecting the overdrive condition. Configuring the overdrive detection circuit can help to further limit large current and/or voltage swings relative to a configuration in which the overdrive detection circuit controls an impedance of a feedback circuit of a single stage.

In certain configurations, the feedback circuit 46 includes a FET having a channel electrically connected in parallel with a resistor or other impedance that can be bypassed when the FET is turned on. For example, the overdrive detection circuit 45 can control a gate voltage of the FET to control an overall impedance of the feedback circuit 46. In one embodiment, the overdrive detection circuit 45 is configured to gradually turn on the FET of the feedback circuit 46 in response to detection of an overdrive condition. Configuring the overdrive detection circuit 45 in this manner can inhibit a sudden change in the gain of the RF amplification system 40. In other embodiments, the overdrive detection circuit 45 can control the FET either in a high-impedance OFF state or in a low-impedance ON state.

Additional details of the RF amplification system 40 can be similar to those described earlier.

Figure 5:
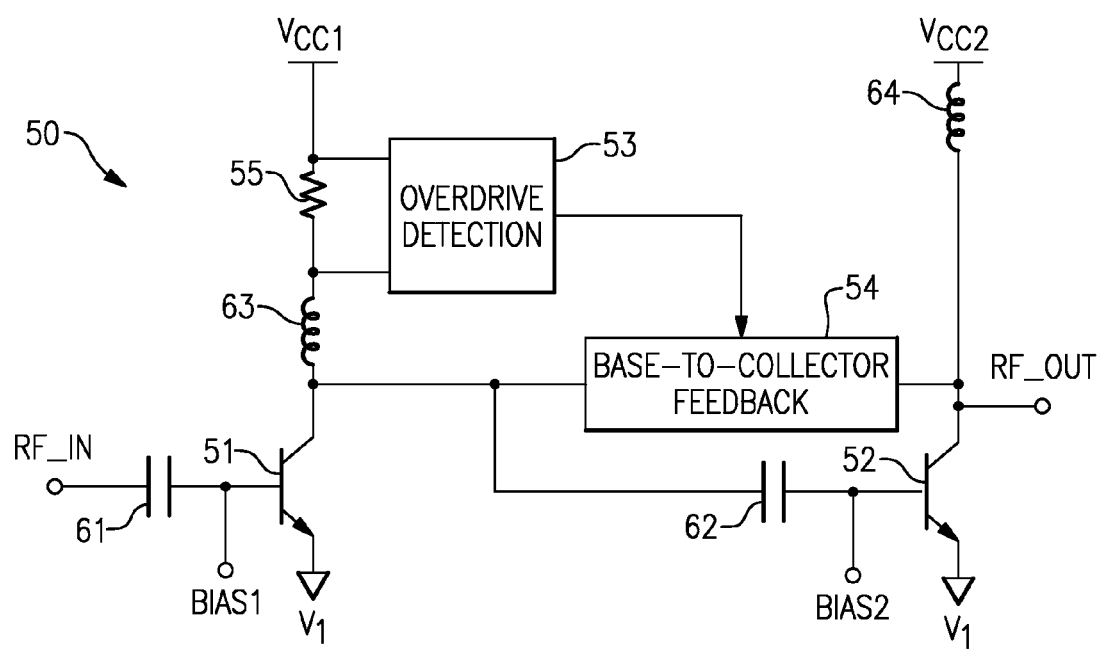
FIG. 5 is a circuit diagram of a power amplifier system according to one embodiment.

FIG. 5 is a circuit diagram of a power amplifier system 50 according to one embodiment. The power amplifier system 50 includes an input stage bipolar transistor 51, an output stage bipolar transistor 52, an overdrive detection circuit 53, a base-to-collector feedback circuit 54, a sense resistor 55, an input stage DC blocking capacitor 61, an output stage DC blocking capacitor 62, an input stage supply inductor 63, and an output stage supply inductor 64.

Although FIG. 5 illustrates one implementation of a power amplifier including overdrive protection, skilled artisans will appreciate that the teachings described herein can be applied to a variety of power amplifier systems, including, for example, power amplifiers employing different biasing schemes and/or power amplifiers including additional stages and/or power amplifiers using other types of transistors such as FET transistors. For example, the teachings herein are application to configurations in which an overdrive detection circuit determines whether or not the power amplifier is in an overdrive condition based on a drain-to-source ($I_{DS}$) current of a FET input stage. In such configurations, when the overdrive detection circuit detects an overdrive condition, the overdrive detection circuit can control an impedance of a drain-to-gate feedback circuit of one or more FET stages subsequent to the FET input stage in a signal path to reduce the power amplifier's gain.

Furthermore, although FIG. 5 illustrates an overdrive detection circuit in the context of a power amplifier system, the teachings herein are also applicable to other radio frequency amplification systems. For example, the teachings herein can also be applied to low noise amplifiers (LNAs) and/or driver amplifiers (DAs).

As shown in FIG. 5, a base of the input stage bipolar transistor 51 is biased using a first bias signal BIAS1 and a base of the output stage bipolar transistor 52 is biased using a second bias signal BIAS2. The first and second bias signals BIAS1, BIAS2 can be generated by a power amplifier bias circuit, such as the power amplifier bias circuit 30 of FIG. 3. The input stage DC blocking capacitor 61 and the output stage DC blocking capacitor 62 have been included to facilitate DC biasing of the input stage bipolar transistor 61 and the output stage bipolar transistor 62.

The collector of the input stage bipolar transistor 51 is electrically connected to a first power high supply voltage $V_{CC1}$ through the input stage supply inductor 63 and the sense resistor 55. Additionally, the collector of the output stage bipolar transistor 52 is electrically connected to a second power high supply voltage $V_{CC2}$ through the output stage supply inductor 64. The input stage supply inductor 63 and the output stage supply inductor 64 can aid in powering the power amplifier 50, while providing impedance sufficient to block RF signals generated by the power amplifier 50 from reaching the first and second power high supply voltages $V_{CC1}$, $V_{CC2}$. As shown in FIG. 5, the emitters of the input stage bipolar transistor 51 and the output stage bipolar transistor 52 are electrically connected to a first voltage $V_1$, which can be a ground or power low supply voltage.

In the illustrated configuration, the input stage supply inductor 63 and the sense resistor 55 are arranged in a series between the first power high supply voltage $V_{CC1}$ and the collector of the input stage bipolar transistor 51 such that the input stage supply inductor 63 is electrically connected between the sense resistor 55 and the collector of the input stage bipolar transistor 51. Configuring the series combination of the input stage supply inductor 63 and the sense resistor 55 in this manner can aid in isolating the sense resistor 55 and the overdrive detection circuit 53 from RF signal components. Accordingly, the overdrive detection circuit 53 can be used to sense a low frequency or DC component associated with input overdrive.

In certain configurations, a decoupling capacitor (not illustrated in FIG. 5) is electrically connected in shunt with the input stage supply inductor 63. The decoupling capacitor can provide a low impedance path to high frequency signals, thereby reducing the noise of the first power high supply voltage $V_{CC1}$, improving power amplifier stability, improving the performance of the input stage supply inductor 63 as an RF choke, and/or enhancing RF isolation of the sense resistor 55 and the overdrive detection circuit 53.

The power amplifier system 50 can amplify an RF input signal RF_IN to generate an RF output signal RF_OUT. In particular, the RF input signal RF_IN is provided to the base of the input stage bipolar transistor 51. The collector of the input stage bipolar transistor 51 can provide an amplified version of the RF input signal RF_IN to the base of the output stage bipolar transistor 52. The output stage bipolar transistor 52 can provide further amplification, and the collector of the output stage bipolar transistor 52 can generate the amplified the output signal RF_OUT.

The power amplifier 50 includes the base-to-collector feedback circuit 54, which is electrically connected between the base and the collector of the output stage bipolar transistor 52. When the impedance of the base-to-collector feedback circuit 54 is relatively high, the base-to-collector feedback circuit 54 can have a relatively small impact on the gain of the output stage bipolar transistor 52. However, when the impedance of the base-to-collector feedback circuit 54 is relatively small, the base-to-collector feedback circuit 54 decreases the gain of the output stage bipolar transistor 52, thereby reducing the overall gain of the power amplifier 50.

In the illustrated configuration, a collector current of the input stage bipolar transistor 51 flows through the sense resistor 55. Additionally, the overdrive detection circuit 53 can detect a voltage across the sense resistor 55 to determine whether or not an overdrive condition is present. Since the collector current of the input stage bipolar transistor 51 can be relatively large when the power amplifier 50 is overdriven, the voltage across the sense resistor 55 can indicate whether or not the RF input signal RF_IN has a power sufficient to overdrive the power amplifier 50.

The overdrive detection circuit 53 can control an impedance of the base-to-collector feedback circuit 54 based on whether or not the overdrive detection circuit 53 detects an overdrive drive condition. For example, in response to detection of an overdrive condition, the overdrive detection circuit 53 can decrease the impedance of the base-to-collector feedback circuit 54 to decrease the power amplifier's gain.

In certain configurations, the base-to-collector feedback circuit 54 includes a field-effect transistor (FET) having a channel electrically connected between the base and the collector of the output stage bipolar transistor 52. Additionally, the channel of the FET can be electrically connected in parallel with a resistor or other impedance that can be bypassed when the FET is turned on. For example, the overdrive detection circuit 53 can control a gate voltage of the FET to control an overall impedance of the base-to-collector feedback circuit 54.

Additional details of the power amplifier system 50 can be similar to those described earlier.

Figure 6:
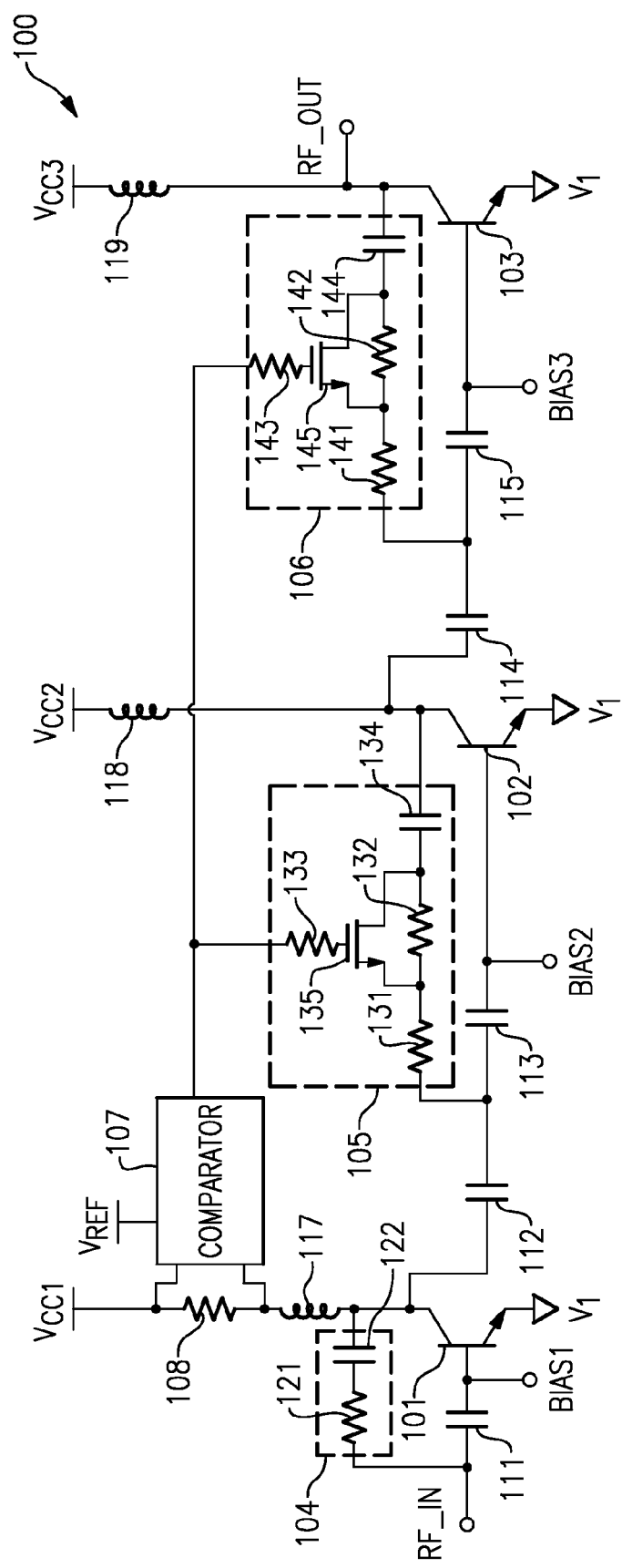
FIG. 6 is a circuit diagram of a power amplifier system according to another embodiment.

FIG. 6 is a circuit diagram of a power amplifier system 100 according to another embodiment. The power amplifier system 100 includes an input stage bipolar transistor 101, an intermediate stage bipolar transistor 102, an output stage bipolar transistor 103, an input stage base-to-collector feedback circuit 104, an intermediate stage base-to-collector feedback circuit 105, an output stage base-to-collector feedback circuit 106, a comparator 107, a sense resistor 108, a first DC blocking capacitor 111, a second DC blocking capacitor 112, a third DC blocking capacitor 113, a fourth DC blocking capacitor 114, a fifth DC blocking capacitor 115, an input stage supply inductor 117, an intermediate stage supply inductor 118, and an output stage supply inductor 119.

As shown in FIG. 6, a base of the input stage bipolar transistor 101 is biased using a first bias signal BIAS1, a base of the intermediate stage bipolar transistor 102 is biased using a second bias signal BIAS2, and a base of the output stage bipolar transistor 103 is biased using a third bias signal BIAS3. The bias signals can be generated by a power amplifier bias circuit.

The collector of the input stage bipolar transistor 101 is electrically connected to a first power high supply voltage $V_{CC1}$ through the input stage supply inductor 117 and the sense resistor 108. Additionally, the collector of the intermediate stage bipolar transistor 102 is electrically connected to a second power high supply voltage $V_{CC2}$ through the intermediate stage supply inductor 118, and the collector of the output stage bipolar transistor 103 is electrically connected to a third power high supply voltage $V_{CC3}$ through the output stage supply inductor 119. The first to fifth DC blocking capacitors 111-115 have been used to provide DC blocking between an input stage, intermediate stage, and output stage of the power amplifier system 100, which can aid in biasing the power amplifier system 100 with the first bias signal BIAS1, the second bias signal BIAS2, and the third bias signal BIAS3. Additionally, as will be described further below, the DC blocking capacitors can help in biasing FET structures associated with base-to-collector feedback circuits.

The power amplifier system 100 can amplify an RF input signal RF_IN to generate an RF output signal RF_OUT using the input stage bipolar transistor 101, the intermediate stage bipolar transistor 102, and the output stage bipolar transistor 103. Although a configuration using three amplification stages is illustrated, the power amplifier system 100 can be adapted to include more or fewer stages.

An input stage base-to-collector feedback circuit 104 includes an input stage feedback resistor 121 and an input stage feedback capacitor 122 electrically connected in series between the base and the collector of the input stage bipolar transistor 101. The input stage base-to-collector feedback circuit 104 can be used to control a gain of the power amplifier's input stage and/or to maintain stability.

The intermediate stage base-to-collector feedback circuit 105 includes a first intermediate stage feedback resistor 131, a second intermediate stage feedback resistor 132, an intermediate stage bias resistor 133, an intermediate stage feedback capacitor 134, and an intermediate stage bypass FET 135. The intermediate stage bypass FET 135 includes a source electrically connected to a first end of the second intermediate stage feedback resistor 132, and a drain electrically to a second end of the second intermediate stage feedback resistor 132. Thus, the intermediate stage bypass FET 135 is electrically connected in parallel with the second intermediate stage feedback resistor 132, and can be used to bypass the second intermediate stage feedback resistor 132 to selectively reduce the impedance of the intermediate stage base-to-collector feedback circuit 105. The first intermediate stage feedback resistor 131 includes a first end electrically connected to a base of the intermediate stage bipolar transistor 102 via the third DC blocking capacitor 113, and a second end electrically connected to the source of the intermediate stage bypass FET 135 and the first end of the second intermediate stage feedback resistor 132. The intermediate stage feedback capacitor 134 includes a first end electrically connected to the drain of the intermediate stage bypass FET 135 and the second end of the second intermediate stage feedback resistor 132, and a second end electrically connected to the collector of the intermediate stage bipolar transistor 102. The intermediate stage bias resistor 133 is electrically connected between an output of the comparator 107 and the gate of the intermediate stage bypass FET 135.

The output stage base-to-collector feedback circuit 106 includes a first output stage feedback resistor 141, a second output stage feedback resistor 142, an output stage bias resistor 143, an output stage feedback capacitor 144, and an output stage bypass FET 145. The output stage bypass FET 145 includes a source electrically connected to a first end of the second output stage feedback resistor 142, and a drain electrically to a second end of the second output stage feedback resistor 142. Thus, the output stage bypass FET 145 is electrically connected in parallel with the second output stage feedback resistor 142, and can be used to bypass the second output stage feedback resistor 142 to selectively reduce the impedance of the output stage base-to-collector feedback circuit 106. The first output stage feedback resistor 141 includes a first end electrically connected to a base of the output stage bipolar transistor 103 via the fifth DC blocking capacitor 115, and a second end electrically connected to the source of the output stage bypass FET 145 and the first end of the second output stage feedback resistor 142. The output stage feedback capacitor 144 includes a first end electrically connected to the drain of the output stage bypass FET 145 and the second end of the second output stage feedback resistor 142, and a second end electrically connected to the collector of the output stage bipolar transistor 103. The output stage bias resistor 143 is electrically connected between the output of the comparator 107 and the gate of the output stage bypass FET 145.

In the illustrated configuration, a collector current of the input stage bipolar transistor 101 flows through the sense resistor 108. Additionally, the comparator 107, which serves as an overdrive detection circuit, can compare a voltage across the sense resistor 108 to a reference voltage $V_{REF}$ to determine whether or not an overdrive condition is present. Additionally, the comparator 107 can control an impedance of the intermediate stage base-to-collector feedback circuit 105 and the output stage base-to-collector feedback circuit 106 based on whether or not the comparator 107 detects an overdrive condition.

In one embodiment, the comparator 107 turns on the first and second FETs 135, 145 when the voltage across the sense resistor 108 is greater than the reference voltage $V_{REF}$, and turns off the first and second FETs 135, 145 when the voltage across the sense resistor 108 is less than or equal to the reference voltage $V_{REF}$.

However, it certain applications it may be desirable for a gain of the power amplifier 100 to saturate during overdrive, rather than having a sudden decrease in gain value, which may impact performance and/or increase a recovery time of the power amplifier 100 after an overdrive condition has occurred.

In one embodiment, the comparator 107 generates a gate control voltage for the first and second FETs 135, 145 to have an analog or continuous voltage. Accordingly, the overdrive detection circuit can gradually turn on the first and second FETs 135, 145 in response to detection of an overdrive condition to inhibit a sudden change in the power amplifier's gain. For example, in certain implementations, rather than generating an output with either a high or low state, the comparator 107 can have a linear output based on a magnitude of the current of the input stage, such as an output that changes by a degree by which voltage across the sense resistor 108 is greater than the reference voltage $V_{REF}$. Configuring overdrive protection in this manner can aid in preventing the power amplifier 100 from operating in deep compression during an overdrive condition.

In the illustrated configuration, the second and third DC blocking capacitors 112, 113 can aid in biasing a source of the intermediate stage bypass FET 135 with a desired bias voltage by providing DC voltage blocking. Additionally, the intermediate stage feedback capacitor 134 can aid in biasing a drain of the intermediate stage bypass FET 135. Furthermore, the fourth and fifth DC blocking capacitors 114, 115 can aid in biasing a source of the output stage bypass FET 145. Furthermore, the output stage feedback capacitor 144 can aid in biasing a drain of the output stage bypass FET 145. Although not illustrated in FIG. 6 for clarity of the figures, skilled artisans will appreciate that bias circuitry can be included for biasing the source and/or drain of the intermediate stage bypass FET 135 and/or output stage bypass FET 145.

Additional details of the power amplifier system 100 can be similar to those described earlier.

Figure 7:
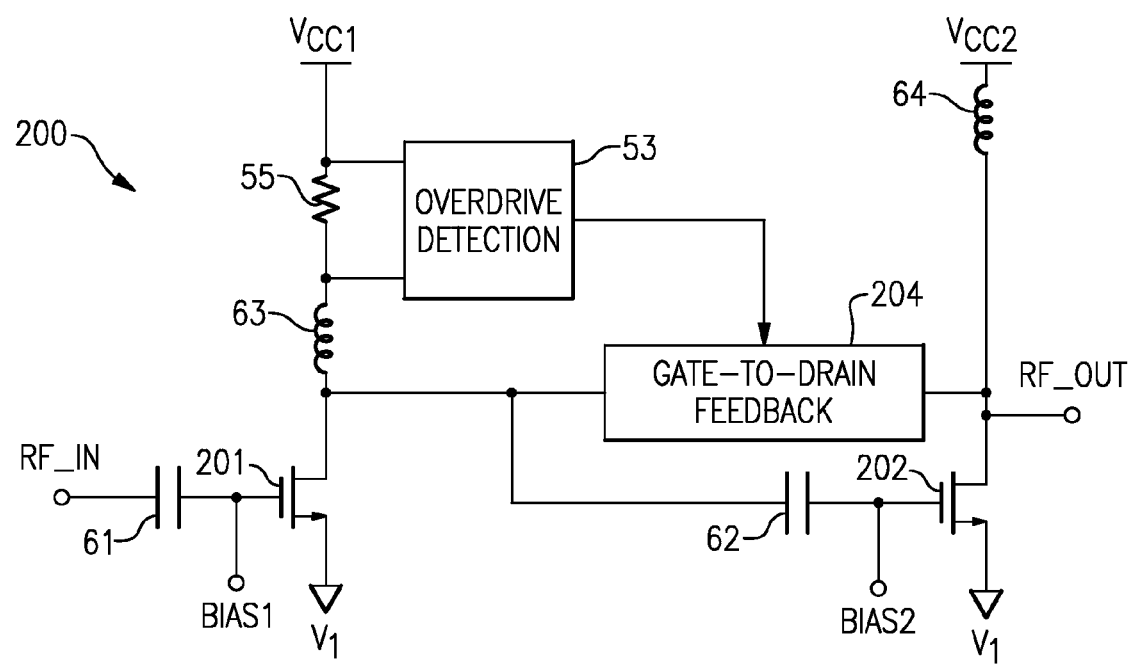
FIG. 7 is a circuit diagram of a power amplifier system according to another embodiment.

FIG. 7 is a circuit diagram of a power amplifier system 200 according to another embodiment. The power amplifier system 200 includes an overdrive detection circuit 53, a sense resistor 55, an input stage DC blocking capacitor 61, an output stage DC blocking capacitor 62, an input stage supply inductor 63, and an output stage supply inductor 64, which can be as described earlier. The power amplifier system 200 further includes an input stage FET 201, an output stage FET 202, and a gate-to-drain feedback circuit 204.

The power amplifier system 200 of FIG. 7 is similar to the power amplifier system 50 of FIG. 5, except that the power amplifier system 200 includes amplification transistors implemented using FETs rather than bipolar transistors. As shown in FIG. 7, the input stage FET 201 includes a gate that receives the RF input signal RF_IN via the input stage DC blocking capacitor 61, a source electrically connected to the first voltage $V_1$ (which can be a ground or power low supply voltage), and a drain electrically connected to a gate of the output stage FET 202 via the output stage DC blocking capacitor 62. The output stage FET 202 includes a source electrically connected to the first voltage $V_1$ and a drain that generates the RF output signal RF_OUT.

As shown in FIG. 7, the gate-to-drain feedback circuit 204 is electrically connected between the gate and drain of the output stage FET 202. Additionally, the overdrive detection circuit 53 is used to detect when an overdrive condition has occurred based on monitoring a current associated with the drain of the input stage FET 201. In response to detecting an overdrive condition, the overdrive detection circuit 53 decreases the impedance of the gate-to-drain feedback circuit 204 to reduce a gain of the power amplifier 200.

Additional details of the power amplifier system 200 can be similar to those described earlier.

Figure 8A:
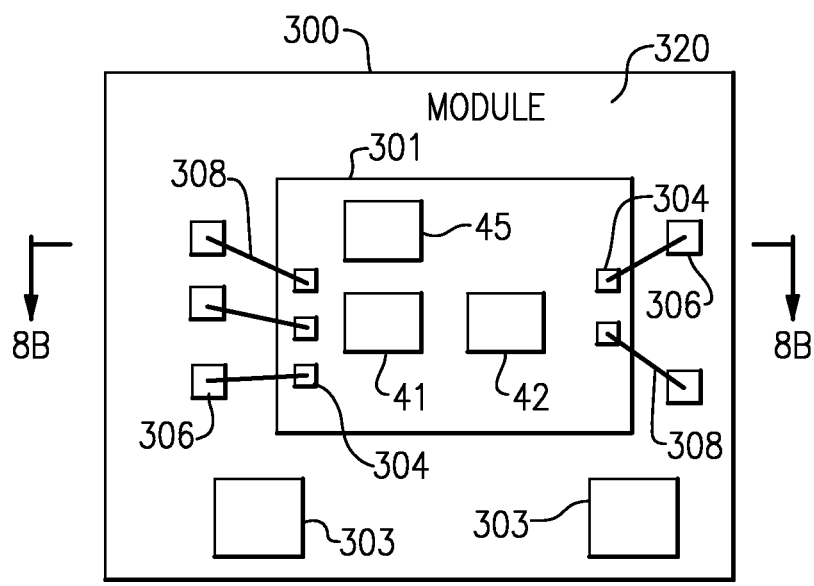
FIG. 8A is a schematic diagram of one embodiment of a packaged module.
Figure 8B:
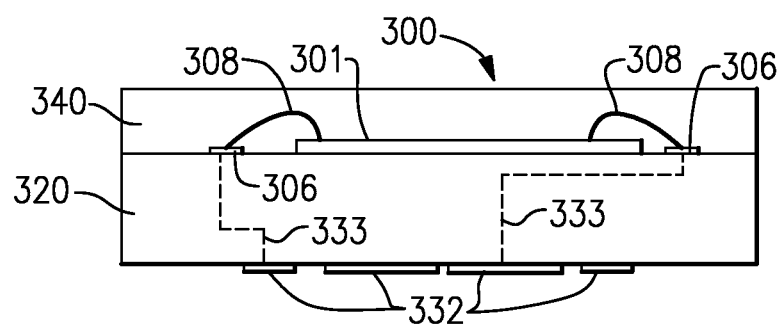
FIG. 8B is a schematic diagram of a cross-section of the packaged module of FIG. 8A taken along the lines 8B-8B.

FIG. 8A is a schematic diagram of one embodiment of a packaged module 300. FIG. 8B is a schematic diagram of a cross-section of the packaged module 300 of FIG. 8A taken along the lines 8B-8B.

The packaged module 300 includes an IC or die 301, surface mount components 303, wirebonds 308, a package substrate 320, and encapsulation structure 340. The package substrate 320 includes pads 306 formed from conductors disposed therein. Additionally, the die 301 includes pads 304, and the wirebonds 308 have been used to electrically connect the pads 304 of the die 301 to the pads 306 of the package substrate 301.

As illustrated in FIGS. 8A and 8B, the die 301 includes a first RF amplification stage 41, a second RF amplification stage 42, and an overdrive detection circuit 45, which can be as described earlier.

The packaging substrate 320 can be configured to receive a plurality of components such as the die 301 and the surface mount components 303, which can include, for example, surface mount capacitors and/or inductors.

As shown in FIG. 8B, the packaged module 300 is shown to include a plurality of contact pads 332 disposed on the side of the packaged module 300 opposite the side used to mount the die 301. Configuring the packaged module 300 in this manner can aid in connecting the packaged module 300 to a circuit board such as a phone board of a wireless device. The example contact pads 332 can be configured to provide RF signals, bias signals, power low voltage(s) and/or power high voltage(s) to the die 301 and/or the surface mount components 303. As shown in FIG. 8B, the electrically connections between the contact pads 332 and the die 301 can be facilitated by connections 333 through the package substrate 320. The connections 333 can represent electrical paths formed through the package substrate 320, such as connections associated with vias and conductors of a multilayer laminated package substrate.

In some embodiments, the packaged module 300 can also include one or more packaging structures to, for example, provide protection and/or facilitate handling of the packaged module 300. Such a packaging structure can include overmold or encapsulation structure 340 formed over the packaging substrate 320 and the components and die(s) disposed thereon.

It will be understood that although the packaged module 300 is described in the context of electrical connections based on wirebonds, one or more features of the present disclosure can also be implemented in other packaging configurations, including, for example, flip-chip configurations.

Applications

Some of the embodiments described above have provided examples in connection with mobile phones. However, the principles and advantages of the embodiments can be used for any other systems or apparatus that have needs for radio frequency amplification.

Such radio frequency amplifier systems can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Conclusion

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio frequency amplification system comprising:
a plurality of radio frequency amplification stages configured to amplify an input signal to generate an output signal, the plurality of radio frequency amplification stages including a first amplification stage and a second amplification stage that is subsequent to the first amplification stage in a signal path, the first amplification stage including a first stage bipolar transistor, and the second amplification stage including a second stage bipolar transistor and a base-to-collector feedback circuit electrically connected between a base and a collector of the second stage bipolar transistor; and
an overdrive detection circuit configured to sense a collector current of the first stage bipolar transistor to detect when an overdrive condition is present, and to decrease an impedance of the base-to-collector feedback circuit in response to detection of the overdrive condition such that a gain of the second stage bipolar transistor is reduced.

2. The radio frequency amplification system of claim 1 wherein the first amplification stage is an input amplification stage and the second amplification stage is an output amplification stage.

3. The radio frequency amplification system of claim 1 wherein the first amplification stage is an input amplification stage and the second amplification stage is an intermediate amplification stage.

4. The radio frequency amplification system of claim 1 wherein the plurality of radio frequency amplification stages includes a plurality of power amplifier stages.

5. The radio frequency amplification system of claim 1 wherein the plurality of radio frequency amplification stages includes a plurality of low noise amplifier stages.

6. The radio frequency amplification system of claim 1 wherein the plurality of radio frequency amplification stages includes a plurality of driver amplifier stages.

7. The radio frequency amplification system of claim 1 further including a sense resistor configured to receive the collector current.

8. The radio frequency amplification system of claim 7 wherein the overdrive detection circuit includes a comparator configured to compare a voltage across the sense resistor to a reference voltage, and to control the impedance of the base-to-collector feedback circuit based on the comparison.

9. The radio frequency amplification system of claim 1 wherein the plurality of radio frequency amplification stages further includes one or more intermediate amplification stages arranged in a cascade between an output of the first amplification stage and an input of the second amplification stage.

10. The radio frequency amplification system of claim 9 wherein a first intermediate amplification stage of the one or more intermediate amplification stages includes an intermediate stage bipolar transistor and an intermediate stage feedback circuit electrically connected between a base and a collector of the intermediate stage bipolar transistor, the overdrive detection circuit further configured to decrease an impedance of the intermediate stage feedback circuit in response to detection of the overdrive condition.

11. The radio frequency amplification system of claim 1 wherein the base-to-collector feedback circuit includes a field effect transistor electrically connected in parallel with a first resistor, the overdrive detection circuit further configured to control a gate voltage of the field effect transistor.

12. The radio frequency amplification system of claim 11 wherein the overdrive detection circuit is further configured to control the gate voltage of the field effect transistor to either turn on the field effect transistor or to turn off the field effect transistor.

13. The radio frequency amplification system of claim 11 wherein the overdrive detection circuit is further configured to control the gate voltage of the field effect transistor with an analog voltage that is based on a magnitude of the collector current.

14. A method of overdrive protection of a radio frequency amplifier, the method comprising:
providing amplification to a signal using a first amplification stage and a second amplification stage that is subsequent to the first amplification stage in a signal path, the first amplification stage including a first stage bipolar transistor, and the second amplification stage including a second stage bipolar transistor and a base-to-collector feedback circuit electrically connected between a base and a collector of the second stage bipolar transistor;
detecting an overdrive condition of the radio frequency amplifier based on sensing a collector current of the first stage bipolar transistor; and
decreasing an impedance of the base-to-collector feedback circuit in response to detecting the overdrive condition such that a gain of the second stage bipolar transistor is reduced.

15. The method of claim 14 wherein detecting the overdrive condition includes providing the collector current to a sense resistor and comparing a voltage across the sense resistor to a reference voltage.

16. The method of claim 14 wherein decreasing the impedance of the base-to-collector feedback circuit includes gradually decreasing the base-to-collector impedance of the feedback circuit to inhibit to a sudden change in the gain of the second stage bipolar transistor.

17. The method of claim 16 further comprising generating an analog voltage based on a magnitude of the collector current and controlling a gate voltage of a field effect transistor of the base-to-collector feedback circuit using the analog voltage.

18. A wireless device comprising:
a transceiver configured to generate a radio frequency signal;
a power amplifier including a plurality of power amplifier stages arranged in a cascade, the plurality of power amplifier stages configured to amplify the radio frequency signal to generate an amplified radio frequency signal, the plurality of power amplifier stages including a first amplification stage and a second amplification stage that is subsequent to the first amplification stage in a signal path of the power amplifier, the first amplification stage including a first stage bipolar transistor, and the second amplification stage including a second stage bipolar transistor and a base-to-collector feedback circuit electrically connected between a base and a collector of the second stage bipolar transistor; and an overdrive detection circuit configured to sense a collector current of the first stage bipolar transistor to detect when an overdrive condition is present, the overdrive detection circuit further configured to decrease an impedance of the base-to-collector feedback circuit in response to detection of the overdrive condition such that a gain of the second stage bipolar transistor is reduced.

19. The wireless device of claim 18 further including a sense resistor configured to receive the collector current.

20. The wireless device of claim 19 wherein the overdrive detection circuit includes a comparator configured to compare a voltage across the sense resistor to a reference voltage, and to control the impedance of the base-to-collector feedback circuit based on the comparison.

* * * * *